United States Patent
Yosef-Hay et al.

(10) Patent No.: US 11,196,428 B1
(45) Date of Patent: Dec. 7, 2021

(54) METHOD AND APPARATUS FOR IMPLEMENTING A QUADRATURE VCO BASED ON STANDARD CELLS

(71) Applicant: Mellanox Technologies, Ltd., Yokneam (IL)

(72) Inventors: Yoni Yosef-Hay, Lyngby (DK); Ulrik Wismar, Kalundborg (DK)

(73) Assignee: Mellanox Technologies, Inc., Yokneam (IL)

( * ) Notice: Subject to any disclaimer, the term of this patent is extended or adjusted under 35 U.S.C. 154(b) by 0 days.

(21) Appl. No.: 17/076,200

(22) Filed: Oct. 21, 2020

(51) Int. Cl.
| | |
|---|---|
| *H03L 7/099* | (2006.01) |
| *H03L 7/081* | (2006.01) |
| *H03K 3/037* | (2006.01) |
| *H03K 3/017* | (2006.01) |
| *H03L 7/187* | (2006.01) |

(52) U.S. Cl.
CPC ............. *H03L 7/099* (2013.01); *H03K 3/017* (2013.01); *H03K 3/037* (2013.01); *H03L 7/0818* (2013.01); *H03L 7/187* (2013.01)

(58) Field of Classification Search
CPC ....... H03L 7/099; H03L 7/0818; H03L 7/187; H03K 3/017; H03K 3/037
See application file for complete search history.

(56) References Cited

U.S. PATENT DOCUMENTS 8,259,888 B2 * 9/2012 Hua .................... H03L 7/0812
375/375

* cited by examiner

*Primary Examiner* — Jung Kim
(74) *Attorney, Agent, or Firm* — Alston & Bird LLP

(57) ABSTRACT

A Quadrature Voltage Controlled Oscillator (Quad VCO) based on standard digital cells and delay cells, is adapted to generate two high-frequency output signals that are "in quadrature", so they both oscillate with similar frequency while exhibiting a mutual phase offset of about 90 degrees, and a) the digital cells include a mix of digital circuits used for implementing standard flip-flop circuits and standard logic gates; and b) the delay cells include circuits accepting a logic signal at their input and outputting a time-delayed version of said input signal, with a time delay that may be varied by a control voltage analog signal that determines the cell delay.

19 Claims, 3 Drawing Sheets

METHOD AND APPARATUS FOR IMPLEMENTING A QUADRATURE VCO BASED ON STANDARD CELLS

FIELD OF THE INVENTION

The present invention relates to Quadrature Voltage Controlled Oscillators (Quad VCO). More particularly, the invention relates to a method and apparatus for implementing on-chip Quad VCOs based on standard digital cells so to mimic the circuit behavior and operating speed of other on-chip digital circuits built with the same architecture located on the same Integrated Circuit (IC). As a result, in addition to its functional task of driving a quadrature circuit such as an IQ modulator/demodulator, the Quad VCO may perform non-functional tasks of assessing and controlling the quality of the fabrication process of the IC, and for providing data on how the process voltage and temperature (PVT) can affect the circuit speed, since the Quad VCO frequency is in direct correspondence to the maximum allowable clocking frequency and operation speed of other on-chip digital circuits.

BACKGROUND OF THE INVENTION

The implementation of modern digital modulation techniques requires the use of a standard circuit architecture known as "Quadrature modulator/demodulator" (hereinafter "Quad circuit"), that includes two analog channels known as "In-phase" channel (hereinafter "I-channel") and "Quadrature" channel (hereinafter "Q-channel"), and two high-frequency periodic signals, both oscillating at identical carrier frequency, but mutually out-of-phase by 90 degrees, one denoted as the "In-phase carrier" (hereinafter "I-carrier") and used to operate the I-channel, and the other denoted as the "Quadrature carrier" (hereinafter "Q-carrier") and used to operate the Q-channel.

During the operation of a Quad circuit, the I-channel and the Q-channel carry each one independent information. In order to obtain a correct system operation, the I and Q channels must be electrically and functionally isolated from each other, as any signal leakage from the I-channel to the Q-channel corrupts the information flowing in the Q-channel, and similarly in the opposite direction. In order for the I-channel and the Q-channel to be perfectly isolated from each other, the I-carrier and the Q-carrier must differ in phase by exactly 90 degrees, from which the term "quadrature" stems. Any phase difference other than exactly 90 degrees will produce a mutual leakage between the I-channel and the Q-channel, with a consequent corruption of information, that worsens as the phase difference deviates from 90 degrees.

If the Quad circuit is required to operate at only one fixed carrier frequency fo, then the I-carrier may be easily derived from the Q-carrier by passing the latter through an electrical network that introduces exactly 90 degrees phase lag at frequency fo. However, if the Quad circuit must operate over a range of carrier frequencies, as required in many instances, no electrical network can be implemented to provide exactly 90 degrees phase lag over the whole frequency range.

In order to optimally operate a Quad circuit over a wide frequency range, the I-carrier and the Q-carrier are both simultaneously generated by a common oscillator, referred to as a Quad VCO. The oscillating frequency of the Quad VCO can be tuned to cover the whole required frequency range by varying a control voltage applied to a VCO port, usually denoted as the "steering line", while the Quad VCO simultaneously outputs two periodic signals that always differ in phase by 90 degrees, regardless of the oscillating frequency. However, conventional high-frequency Quad VCOs are complex circuits employing inductor-capacitor (LC) tank solutions, using a significant amount of on-chip real-estate, power, and control signals, with associated costs and energy consumption.

It is an object of the invention to provide a Quad VCO based on standard digital cells such as flip flops and logic gates.

It is another object of the invention to provide a simple and convenient mechanism for accurately assessing the outcome of the fabrication process of digital ICs, and to control their performance, which largely depend on the outcome of the fabrication process.

Other objects and advantages of the invention will become apparent as the description proceeds.

SUMMARY OF THE INVENTION

The invention relates to a Quadrature Voltage Controlled Oscillator (Quad VCO) based on standard digital cells and delay cells, adapted to generate two high-frequency output signals that are "in quadrature", so they both oscillate with identical frequency while exhibiting a constant mutual phase offset of about 90 degrees, and wherein:

a) the digital cells consist of a mix of digital circuits used for implementing standard flip-flop circuits and standard logic gates; and b) the delay cells consist of circuits accepting a logic signal at their input and outputting a time-delayed version of said input signal, with a time delay that may be varied by means of a control voltage, which is an analog signal that determines the cell delay. In one embodiment, the Quadrature Voltage Controlled Oscillator (Quad VCO) does not include LC resonant tank circuits.

While it is desired to maintain phase offset errors from 90 degrees as close as possible to zero, when driving a Quad VCO modulator/demodulator, to avoid leakage between the Q and I channels, a small offset error, the value of which depends om the application, may be allowed.

According to one embodiment of the invention, the Quad VCO comprises at least two standard D-flip-flop (Delay flip-flop) circuits, two voltage-controlled delay cells, one fixed delay cell, and one XOR (exclusive OR) gate.

In some embodiments, the Quad VCO of the invention is adapted to perform the standalone function of providing two quadrature output signals, each consisting of a square wave of 50% duty cycle. In other embodiments, the oscillating frequency may be set by applying an identical control voltage to both voltage-controlled delay cells, or by applying a different control voltage to each voltage-controlled delay cell.

The Quad VCO of the invention can mimic the behavior of other unrelated digital circuits located on the same IC, thereby allowing the maximal clocking frequency and speed capability of other digital circuits to be put in direct correspondence to the oscillating frequency of the Quad VCO. Moreover, the Quad VCO of the invention is adapted to simultaneously perform a functional task and a non-functional task.

In some embodiments, the voltage-controlled delay-cells are implemented using Metal Oxide Semiconductor (MOS) devices, and the control voltage is applied to a backgate of said MOS devices.

In some embodiments, the oscillating frequency is determined by the delay of the voltage-controlled delay cells. In other embodiments, the propagation delay of the D-flip flops mimic the propagation delay of standard digital cells belonging to other unrelated digital circuits located on the same IC. In still other embodiments, the oscillation start is triggered by a suitable reset sequence.

The invention also encompasses a method for measuring and/or controlling the process outcome of an integrated circuit (IC), comprising providing on an IC a Quadrature Voltage Controlled Oscillator (Quad VCO) based on standard digital cells and delay cells, adapted to generate two high-frequency output signals that are "in quadrature", so they both oscillate with identical frequency while exhibiting a constant and precise mutual phase offset of 90 degrees, and wherein:

a) the digital cells consist of a mix of digital circuits used for implementing standard flip-flop circuits and standard logic gates;

b) the delay cells consist of circuits accepting a logic signal at their input and outputting a time-delayed version of said input signal, with a time delay that may be varied by means of a control voltage; and c) the Quad VCO does not include LC resonant tank circuits;

and reading out its oscillating frequency thereby enabling measuring and/or controlling the process outcome of said IC.

DETAILED DESCRIPTION OF EMBODIMENTS OF THE INVENTION

Figure 1:
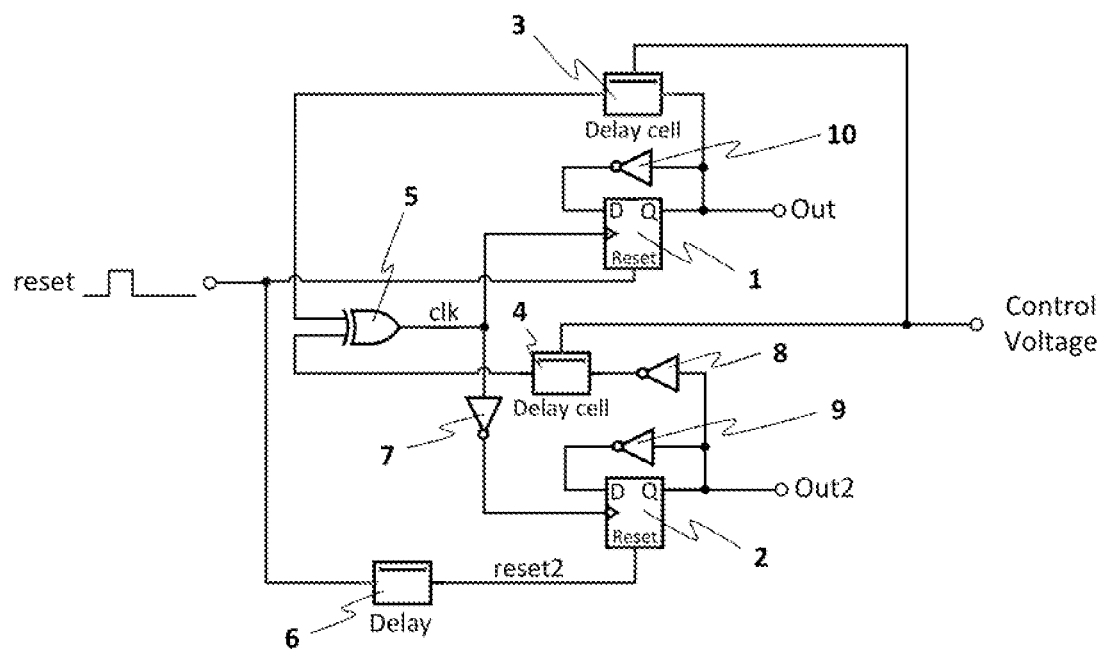
FIG. 1 is a block diagram of an exemplary embodiment of the Quad VCO circuit.

The Quad VCO of the invention is based on standard digital cells such as flip-flops and logic gates. Being based on standard digital cells, the Quad VCO of the invention, in addition to the functional purpose of driving I/Q channels, provides a simple and convenient means to accurately assess the outcome of the fabrication process of digital ICs, and to control their performance, which largely depend on the outcome of the fabrication process.

Some advantages of the invention over the prior art include (but are not limited to) the following:

1. The use of standard cells allows mimicking the circuit behavior and speed of other digital circuits on the same IC. Thus, in addition to its functional purpose, the use of an oscillator built with a mix of standard cells, produces information regarding the process outcome of other on-chip digital circuits, which enables chip binning, monitoring of the process outcome and providing temperature and supply voltage information for similar digital ICs, and evaluation and characterization of the performance of digital circuits during testing, by just measuring the oscillating frequency, and allows process monitoring and control as well as optimal setting of process-dependent parameters.

2. The invention allows for an efficient circuit design and easy customization of the control voltage settings for a required Quad VCO frequency range.

3. As compared to the prior art, the implementation of the invention requires a smaller area, and the operation of the oscillator requires less power consumption. Moreover, the implementation of the invention requires for control only a RESET and voltage control, as opposed to the complex and extensive digital control used by prior art techniques.

Accordingly, the Quad VCO of the invention is based on standard digital cells, so to mimic circuit behavior, operating speed, and propagation delay of other on-chip digital circuits located on the same IC, and delivers two oscillating output signals with a precise mutual phase difference of 90 degrees without requiring complex LC tank solutions, thus utilizing less chip area and power consumption.

Voltage-controlled delay-cells are positioned along signal paths within the Quad VCO circuit, whose oscillating frequency depends on both the variable propagation delay $\tau_{cell}$ of the delay-cells and the fixed propagation delay $\tau_{ff}$ of flip-flops consisting of standard digital cells. Thus, the voltage-control ports of the delay-cells act as a steering line for the purpose of controlling the frequency of the oscillations, which allows to perform a continuous frequency adjustment without the need to stop the oscillations or the generation of the output signals. For instance, voltage-controlled delay-cells may be implemented using MOS devices, by applying a control voltage to a secondary gate related to the well-known "body effect", and often denoted as the "backgate."

Moreover, since the Quad VCO is based on standard digital cells, its oscillating frequency is in direct correspondence to the maximum allowable clocking frequency and operation speed of other on-chip digital circuits. It follows that, in addition to its functional purpose, the Quad VCO of the invention enables chip binning, monitoring of the process outcome for similar digital ICs, and evaluation and characterization of the performance of digital circuits during testing, by just measuring the VCO oscillating frequency, the value of which can be read in the lab and used to set different process-dependent parameters such as gain control, supply voltage scaling, current leakage reduction and power consumption reduction for the digital circuits. Process control of ICs has been done in the art using simple delay-cells only, either as a ring oscillator or in a delay chain. However, one major drawback of prior art solutions is that they don't provide a direct correspondence to the performance of other on-chip digital circuits, since they do not include the timing and delays of actual digital circuits such as flip-flops, as opposed to the invention that includes the actual timing and propagation delays of standard cells used by other on-chip digital circuits.

Figure 3:
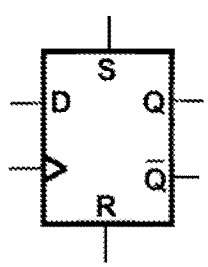
FIGS. 3a, 3b, and 3c show respectively the symbol and the truth-table of the DFF (Delay Flip-Flop), the XOR (Exclusive OR) gate and the NOT (Inverter) gate in the exemplary embodiment of FIG. 1.
Figure 3:
Figure 3:

In the following, for clarity and simplicity, and without loss of generality, the operation of an apparatus according to the invention is described with reference to the exemplary embodiment shown in FIG. 1. From now on, when quoting an indexing number (#), this implicitly refers to the corresponding block in FIG. 1. The description to follow shows that after an initial system reset, the logical output signals (Out,Out2) in the Quad VCO system of the exemplary embodiment of FIG. 1, continuously and cyclically "hop"

through the sequence of states (Out,Out2)={(1,1),(0,1),(0,0),(1,0)}, while each one of said cyclical states lasts for a time period that is directly determined by the propagation delay $\tau_{ff}$ of the DFF shown in FIG. 3a, which is of the order of 50 ps (picoseconds), and by the delay $\tau_{cell}$ introduced by the voltage-controlled delay cells (3) and (4), which may assume values from few ps to hundreds of ps, depending on the Control Voltage applied. The propagation delay through each of the logical gates (7),(8), is of the order of less than 5 ps, which is an order of magnitude smaller that the propagation delay through the DFF, then for ease of understanding, in the description that follows the propagation delay due to the logical gates is neglected as compared to the propagation delay due to the DFF. Inverters (9), and (10) are not in the signal delay path, thus their delay is only required to be less than a value $\tau$, defined in the "Description of the operation," in order to allow properly setting the DFF input before the next rising edge of the clock occurs. If the system needs a very high frequency or very accurate quad outputs, the control voltage applied to each of the delay cells will be different.

Description of an Exemplary Circuit

The block diagram of the exemplary Quad VCO is shown in FIG. 1.

Figure 2:
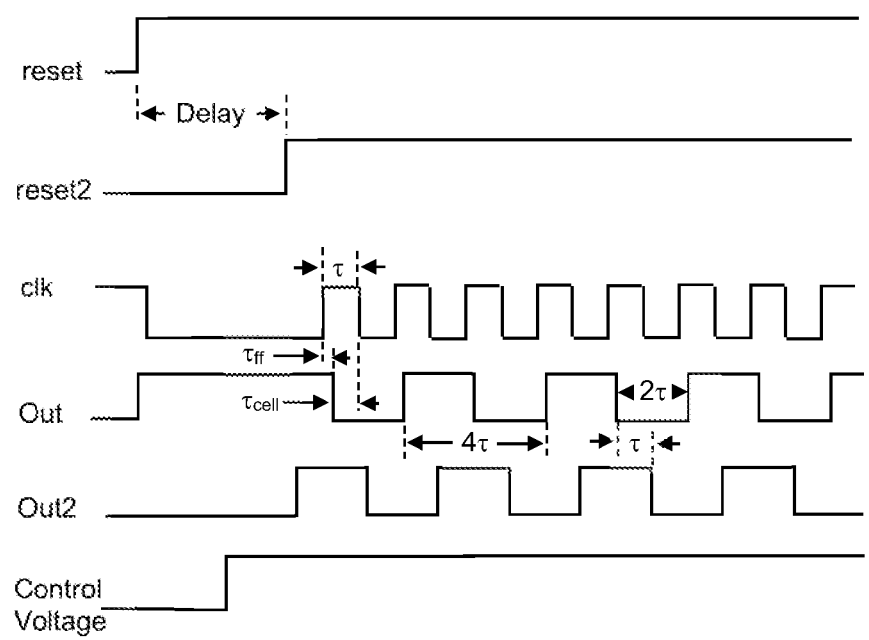
FIG. 2 is a waveform diagram describing the timing of the logic signals and of the control voltage in the exemplary embodiment of FIG. 1.

Block (6) is a fixed delay-cell that accepts a "reset" signal, whose function is to trigger the oscillation start. The above delay-cell outputs a signal "reset2", which consists of a delayed version of the signal "reset". The relative delay between "reset" and "reset2" is shown in FIG. 2.

Figure 4:
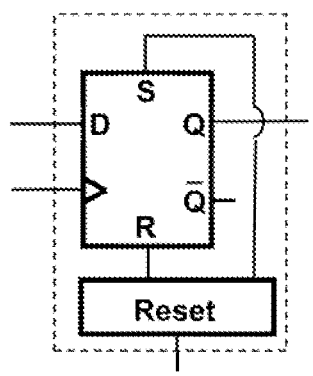
FIG. 4a shows the details of the symbol of FIG. 4b, which is used in FIG. 1. The operation of the sub-block "Reset" is explained in the "Description of the operation;"
Figure 4:
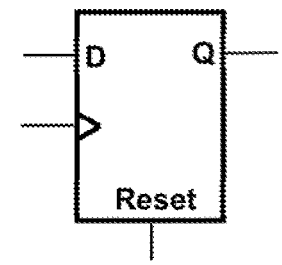
Figure 6:
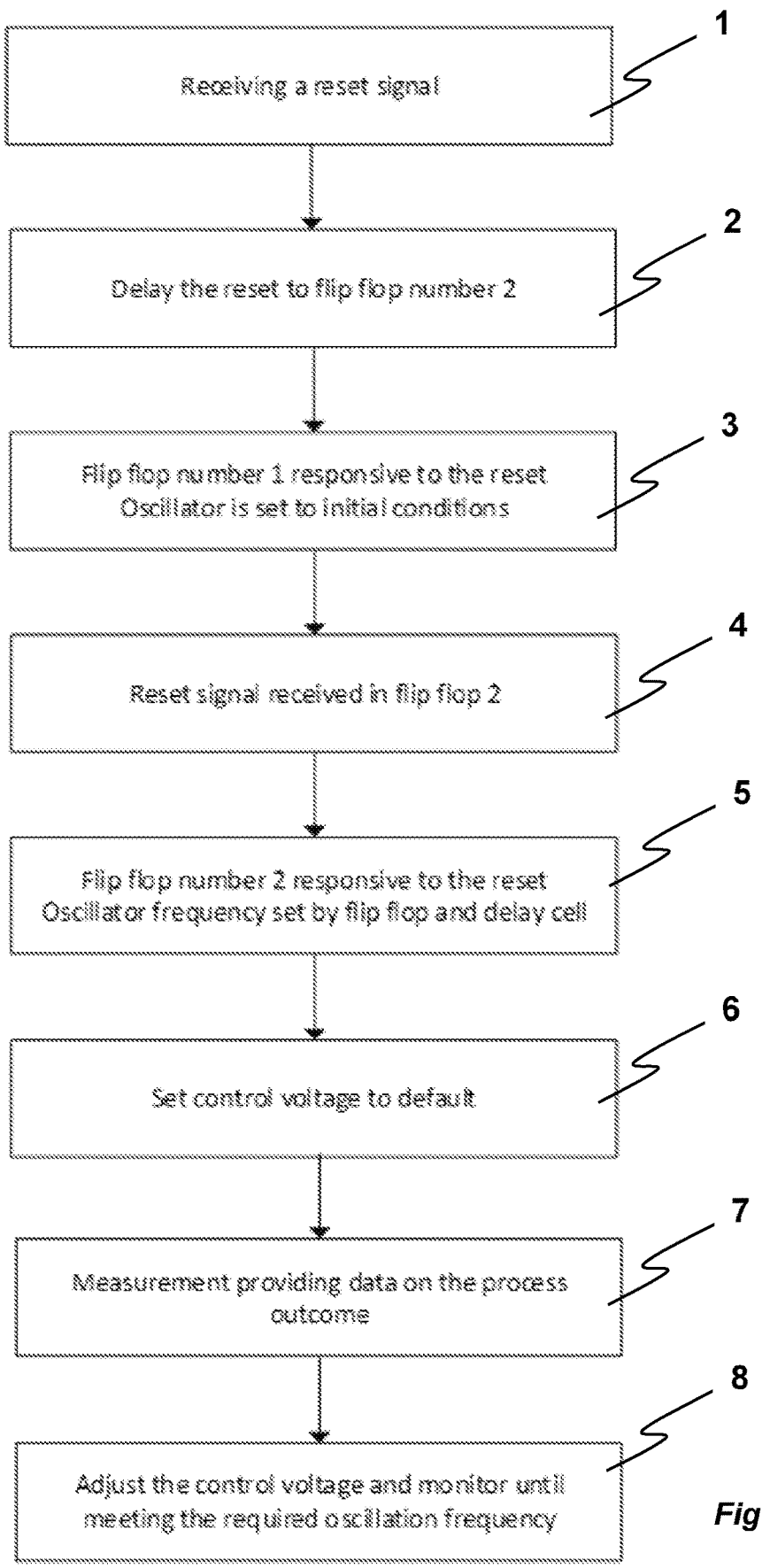
FIG. 6 is a flow-chart summarizing the steps described in detail in the description of the operation of one embodiment.

Blocks (1) and (2) are identical subsystems, the symbol of which is shown in FIG. 4b and detailed in FIG. 4a, each including a standard DFF the truth table of which is given in FIG. 3a, and a "Reset" circuit required to properly initialize the operation of the Quad VCO upon power-up, and to trigger oscillation start upon applying the "reset" signal shown in FIG. 2, and the detailed operation of which is described hereinafter in the section "description of the operation". The symbol ">" in FIG. 3a denotes the clock-in port that accepts the "clock" signal shown in the truth-table of the DFF, implying that the DFF is sensitive only to a rising edge of the clock signal. Flip flop 1 and flip flop 2, described in FIG. 6, are the identical standard DFF included in block(1) and block(2) respectively.

Blocks (9) and (10) are NOT gates, whose symbol is shown in FIG. 3c. Each one of the above NOT gates connects the Q output to the D input of the associated DFF. According to the truth-table in FIG. 3a, and to the logical inversion performed by the NOT gate as shown in FIG. 3c, such a connection forces a change of state at the output of DFF whenever a rising signal edge reaches the clock-in port of the DFF. Thus, the DFF associated with block (1) inverts its logical state (from "0" to "1" or from "1" to "0") whenever block (5) outputs a rising edge.

Block (7) is a NOT gate that inverts the logical state of the output signal of block (5). Thus, the DFF associated with block (2) inverts its logical state whenever block (5) outputs a falling edge. It follows that Out and Out2 never change their state simultaneously.

Block (5) is a XOR gate, which, according to the symbol and the associated truth-table in FIG. 3b outputs a signal Q="1" if A is different from B, and Q="0" if A is equal to B. It follows from FIG. 1 that, if both signal Out and Out2 reached the same logic state, since the NOT gate (8) inverts the state of Out2, then after the delay introduced by the delay cells (3) and (4), the output of the XOR gate (5) yields clk="1", else it yields clk="0".

Description of the Operation of One Embodiment

All that follows is described with reference to the block diagram of FIG. 1 and the waveform diagram of FIG. 2. When quoting an indexing number, it is implicitly referred to the corresponding block in FIG. 1. It is assumed for simplicity and without loss of generality, that the delays of the voltage-controlled delay-cells are identical, and the delays of the flip-flops are identical, so to obtain an oscillating waveform with 50% duty cycle. However, waveforms with duty cycle other than 50% may be readily obtained by making the delays of the voltage-controlled delay-cells different from each other, and will require two delay cell control voltages.

Upon power-up, the Reset circuit forces the initial state Out=Out2="0" by setting R="1" and S="0" on both DFF for a short time, and then holding stably S=R="0". The analog Control Voltage port is kept low, because in the exemplary system the delay cell has maximum delay when the voltage is low. Startup may be speeded-up setting the control voltage to its maximal value. However, the delay difference is of the order of only hundreds of picoseconds, and is negligible for all practical purposes. After a short delay due to the delay cells (3) and (4), the Quad VCO remains quiescent until activated as follows:

1. At this point the system state is quiescent at (Out,Out2)=(0,0), so that the inputs to the XOR gate (5) have different quiescent values due to the inverter after Out2, and therefore, according to the truth-table in FIG. 3b, the output of the XOR gate yields clk="1".

Now a rising edge signal "reset" is applied to the "Reset" input of block (1). This is shown in step(1) of FIG. 6. At the same time, a delayed version of the above "reset" signal, denoted by "reset2" is routed to flip flop 2a shown in step(2) of FIG. 6. Upon receiving the rising edge, the "Reset" circuit in FIG. 4a applies a short "1" pulse to the S input of the associated DFF, while holding at "0" the R input. The DFF reacts to the pulse on the S input with negligible delay. Therefore, according to the truth-table in FIG. 3a the DFF output port "Out" is set to "1" with negligible delay. This is shown in step(3) of FIG. 6. The implementation of a "Reset" circuit for performing the actions described above is not shown in detail, as it is a simple standard design for any person skilled in the art.

2. At this point the state is (Out,Out2)=(1,0), and after the delay introduced by the delay cell (3), the inputs to the XOR gate (5) are both set to "1", and therefore, according to the truth-table in FIG. 3b, the output of the XOR gate yields clk="0".

3. The Control Voltage line is now set to the default analog voltage value required to set the delay-cells so to achieve the required default oscillation frequency. The control voltage will take effect as both DFF are properly preset upon completing the reset sequence.

4. After the delay due to the fixed delay cell (6), which is shown in FIG. 2, and set to be long enough so the "clk" has stabilized at "0", the delay cell (6) outputs a rising edge signal "reset2" to the "Reset" input of block (2). This is shown in step(4) of FIG. 6. Upon receiving the rising edge, the "Reset" circuit in FIG. 4a applies a short "1" pulse to the S input of the associated DFF. Therefore, according to the truth table in FIG. 3a the DFF output port "Out2" is set to "1" with negligible delay. This is shown in step(5) of FIG. 6. In order for the system to operate properly, the RESET function must complete its action in a time shorter than a value 2τ, where τ is defined in the "Description of the operation."

5. At this point, the reset sequence is completed and the control voltage takes effect as shown in step(6) of FIG. 6, determining the oscillation frequency as described next. The system state is Out=1, Out2=1, clk=0, and therefore after a delay $\tau_{cell}$ resulting from the delay-cell (4), the signal "clk" rises from "0" to "1". Let us denote the instant at which the above rising edge of "clk" occurred as $t_{rise}$.

6. Since a rising clock occurred at $t_{rise}$, a change of state occurs in the DFF of block (1), thus "Out" goes from "1" to "0" after a delay $\tau_{ff}$, which is the delay due to the DFF. Therefore, the instant at which the above change of state occurred is $t_{rise}+\tau_{ff}$.

7. At this point Out=0, Out2=1 and therefore "clk" goes to "0" after a delay $\tau_{cell}$ due only to the delay-cell (3). If the instant at which the above falling edge of "clk" occurred is denoted as $t_{fall}$, then $\tau_{fall}=\tau_{rise}+\tau_{ff}+\tau_{cell}$. It follows that the time period during which the clock remained in the "1" state is $\tau=\tau_{fall}-\tau_{rise}=\tau_{ff}+\tau_{cell}$.

8. Since the clock signal that the DFF of block (2) receives consists of "clk" after passing through the inverter (7), whose delay is negligible, then the DFF of block (2) receives a rising clock edge at time $\tau_{fall}$. Therefore "Out2" goes to "0" after at a delay $\tau_{ff}$.

9. At this point Out=0, Out2=0 and therefore "clk" goes back to "1" after a delay $\tau_{cell}$ due only to the delay-cell (4). It follows that the time period during which the clock remained in the "0" state is also $\tau_{ff}=\tau_{cell}=\tau$.

10. Due to the rising edge of "clk", the output of the DFF of block (1) changes its state to Out=1 after a delay $\tau_{ff}$.

11. At this point Out=1, Out2=0 and therefore "clk" goes to "0" after a delay $\tau_{cell}$ due only to the delay-cell (3). It follows that the time period during which the clock remained in the "1" state is $\tau_{ff}+\tau_{cell}=\tau$, and at this instant the DFF of block (2) receives a rising clock edge.

12. Since the DFF of block (2) received a rising clock edge, "Out2" goes to "1" after at a delay $\tau_{ff}$.

13. At this point Out=1, Out2=1, clk=0, and therefore "clk" rises from "0" to "1" after a delay $\tau_{cell}$ due to the delay-cell (4). It follows that the time period during which the clock remained in the "0" state is $\tau_{ff}+\tau_{cell}=\tau$. Let us denote the instant at which the above rising edge of "clk" occurred as $\tau'_{rise}$.

It should be noted that the system state at time $\tau'_{rise}$ described under (13) above, is identical to the system state described at time $\tau_{rise}$ under (5) above, therefore, once started, the cycle described from (5) through (13) above repeats indefinitely, which means that oscillations occur, with a clock period of duration $2\tau=2(\tau_{ff}+\tau_{cell})$, and signals "Out" and "Out2" of period of duration T equal to two clock periods, namely, $T=4\tau=4(\tau_{ff}+\tau_{cell})$. Moreover the concurrent states of the outputs (Out,Out2) are given respectively by the cyclical sequence (1,1),(0,1),(0,0),(1,0) that repeats with period T, namely, the waveforms describing the states of "Out" and "Out2" are identical in shape, but are staggered by a time segment of length τ, namely T/4. Since the all period T covers 360 degrees, T/4 covers 90 degrees. Therefore, the two oscillator outputs Out and Out2 are out-of-phase by exactly 90 degrees.

Figure 5:
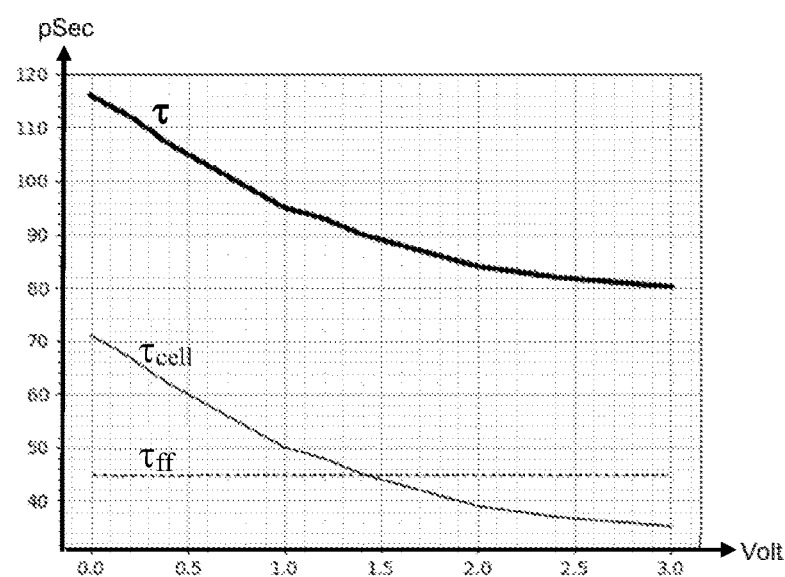
FIG. 5 shows the fixed DFF delay, and the variable delay of a delay cells (3) and (4) as a function of the Control Voltage in the exemplary embodiment of FIG. 1.

FIG. 5 shows the fixed delay ($\tau_{ff}$) of the DFF, the variable delay ($\tau_{cell}$) of each voltage-controlled delay cell, and the composite delay $\tau=\tau_{ff}+\tau_{cell}$ as a function of the value of the Control Voltage simultaneously applied to both delay-cells (3) and (4).

At this point the oscillating voltage may be measured to provide data on the process outcome, as shown in step(7) of FIG. 6, and the control voltage may be adjusted to and monitored until meeting the required oscillation frequency as shown in step(8) of FIG. 6.

All the above description of exemplary embodiments of the invention has been provided for the purpose of illustration and is not intended to limit the invention in any way. Many different uses can be devised for the Quad VCO of the invention, which can be of different configurations and implemented in many different integrated circuits, all without exceeding the scope of the inventions.

The invention claimed is:

1. A Quadrature Voltage Controlled Oscillator (Quad VCO) based on digital cells and delay cells, adapted to generate two high-frequency output signals that are in quadrature, so they both oscillate with similar frequency while exhibiting a mutual phase offset of about 90 degrees, and wherein:
   a) the digital cells include a mix of digital circuits used for implementing flip-flop circuits and logic gates; and
   b) the delay cells include circuits accepting a logic signal at their input and outputting a time-delayed version of said input signal, with a time delay that may be varied by a control voltage analog signal that determines the cell delay.

2. The Quad VCO according to claim 1, comprising at least: two D flip-flop (Delay flip-flop) circuits, two voltage-controlled delay cells, one fixed delay cell, and one XOR (exclusive OR) gate.

3. The Quad VCO of claim 2, adapted to provide two quadrature output signals, each comprising a square wave of about 50% duty cycle.

4. The Quad VCO of claim 1, wherein the oscillating frequency is set by applying a same control voltage to both voltage-controlled delay cells, or by applying a different control voltage to each voltage-controlled delay cell.

5. The Quad VCO of claim 4, configured to mimic the behavior of other unrelated digital circuits located on the same integrated circuit (IC) on which the Quad VCO is located, thereby allowing the maximal clocking frequency and speed capability of other digital circuits to be put in direct correspondence to the oscillating frequency of the Quad VCO.

6. The Quad VCO of claim 1, configured to simultaneously performs a functional task and a non-functional task.

7. The Quad VCO of claim 6, wherein the non-functional task comprises mimicking the behavior of unrelated digital circuits located on the same integrated circuit (IC).

8. The Quad VCO of claim 7, configured to allow the maximal clocking frequency and speed capability of other digital circuits to be put in direct correspondence to the oscillating frequency of the Quad VCO.

9. The Quad VCO of claim 6, wherein the non-functional task comprises allowing the optimization of the integrated circuit (IC) fabrication process.

10. The Quad VCO of claim 2, wherein the voltage-controlled delay-cells are implemented using Metal Oxide Semiconductor (MOS) devices, and the control voltage is applied to a backgate of said MOS devices.

11. The Quad VCO of claim 2, wherein the oscillating frequency is determined by the delay of the voltage-controlled delay cells.

12. The Quad VCO of claim 2, wherein the propagation delay of the D-flip flops mimics the propagation delay of digital cells belonging to other unrelated digital circuits located on the same IC.

13. The Quad VCO of claim 2, wherein the oscillation start is triggered by a suitable reset sequence.

14. A method for measuring and/or controlling the process outcome of an integrated circuit (IC), comprising:
- (i) providing on an IC a Quadrature Voltage Controlled Oscillator (Quad VCO) based on digital cells and delay cells, adapted to generate two high-frequency output signals that are in quadrature, so they both oscillate with similar frequency while exhibiting a mutual phase offset of about 90 degrees, wherein:
  - a) the digital cells include a mix of digital circuits used for implementing flip-flop circuits and logic gates;
  - b) the delay cells include circuits accepting a logic signal at their input and outputting a time-delayed version of said input signal, with a time delay that may be varied by means of a control voltage analog signal that determines the cell delay;
- (ii) reading out its oscillating frequency thereby enabling measuring and/or controlling the process outcome of said IC.

15. The method of claim 14, wherein the Quad VCO does not include inductor-capacitor (LC) resonant tank circuits.

16. The method of claim 14, wherein the Quad VCO comprises at least two D-flip-flop (Delay flip-flop) circuits, two voltage-controlled delay cells, one fixed delay cell, and one XOR (exclusive OR) gate.

17. The method of claim 16, wherein the Quad VCO is adapted to provide two quadrature output signals, each comprising a square wave of about 50% duty cycle.

18. The method of claim 14, wherein the oscillating frequency is set by applying a same control voltage to both voltage-controlled delay cells, or by applying a different control voltage to each voltage-controlled delay cell.

19. The method of claim 14, wherein the Quad VCO is configured to mimic the behavior of other unrelated digital circuits located on the same integrated circuit on which the Quad VCO is located, thereby allowing the maximal clocking frequency and speed capability of other digital circuits to be put in direct correspondence to the oscillating frequency of the Quad VCO.

* * * * *